(12) United States Patent
Scardera et al.

(10) Patent No.: US 9,306,087 B2
(45) Date of Patent: Apr. 5, 2016

(54) METHOD FOR MANUFACTURING A PHOTOVOLTAIC CELL WITH A LOCALLY DIFFUSED REAR SIDE

(75) Inventors: Giuseppe Scardera, Sunnyvale, CA (US); Maxim Kelman, Mountain View, CA (US); Elena V Rogojina, San Jose, CA (US); Dmitry Poplavskyy, San Jose, CA (US); Elizabeth Tai, Cupertino, CA (US); Gonghou Wang, Foster City, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 408 days.

(21) Appl. No.: 13/602,919

(22) Filed: Sep. 4, 2012

(65) Prior Publication Data
US 2014/0065764 A1 Mar. 6, 2014

(51) Int. Cl.
| H01L 21/22 | (2006.01) |
| H01L 21/368 | (2006.01) |
| H01L 21/208 | (2006.01) |
| H01L 31/0224 | (2006.01) |
| H01L 31/068 | (2012.01) |
| H01L 31/18 | (2006.01) |

(52) U.S. Cl.
CPC .... H01L 31/022441 (2013.01); H01L 31/0682 (2013.01); H01L 31/1804 (2013.01); *Y02E 10/547* (2013.01); *Y02P 70/521* (2015.11)

(58) Field of Classification Search
None
See application file for complete search history.

(56) References Cited

U.S. PATENT DOCUMENTS

| 4,104,091 A * | 8/1978 | Evans et al. .................. 438/57 |
| 6,695,903 B1 * | 2/2004 | Kubelbeck et al. ...... 106/287.14 |
| 7,998,863 B2 | 8/2011 | Wenham et al. |
| 2006/0060238 A1 * | 3/2006 | Hacke et al. .................. 136/256 |
| 2006/0183303 A1 * | 8/2006 | Inui et al. ..................... 438/487 |
| 2007/0151598 A1 | 7/2007 | De Ceuster et al. |
| 2010/0081264 A1 | 4/2010 | Leung et al. |
| 2011/0003424 A1 | 1/2011 | De Ceuster et al. |
| 2011/0186118 A1 * | 8/2011 | Kim ............................ 136/256 |

(Continued)

FOREIGN PATENT DOCUMENTS

| WO | 2008/115814 A2 | 9/2008 |
| WO | 2012/054426 A2 | 4/2012 |

OTHER PUBLICATIONS

L. M. Porter, A. Teicher, and D. L. Meier, "Phosphorus-doped, silver-based pastes for self-doping ohmic contacts for crystalline silicon solar cells," Solar Energy Materials and Solar Cells, vol. 73, 2002, pp. 209-219.*

(Continued)

*Primary Examiner* — Calvin Choi
*Assistant Examiner* — Xiaoming Liu

(57) ABSTRACT

A method for manufacturing a photovoltaic cell with a locally diffused rear side, comprising steps of: (a) providing a doped silicon substrate, the substrate comprising a front, sunward facing, surface and a rear surface; (b) forming a silicon dioxide layer on the front surface and the rear surface; (c) depositing a boron-containing doping paste on the rear surface in a pattern, the boron-containing paste comprising a boron compound and a solvent; (d) depositing a phosphorus-containing doping paste on the rear surface in a pattern, the phosphorus-containing doping paste comprising a phosphorus compound and a solvent; (e) heating the silicon substrate in an ambient to a first temperature and for a first time period in order to locally diffuse boron and phosphorus into the rear surface of the silicon substrate.

20 Claims, 16 Drawing Sheets

(56) References Cited

U.S. PATENT DOCUMENTS

2013/0178011 A1* 7/2013 Ginley et al. ............... 438/98
2014/0373909 A1* 12/2014 Zhang et al. ............... 136/256

OTHER PUBLICATIONS

Verlinden P.J., Swanson, R.M., Crane, R. A., 7000 High-efficiency Cells for a Dream, Progress in Photovoltaics: Research and Applications, vol. 2, pp. 143-152 (1994).

Granek, Filip, High-Efficiency Back-Contact Back-Junction Silicon Solar Cells, Dissertation, Fraunhofer Institut fur Solare Energiesysteme (ISE) Freiburg im Breisgau, 2009.

Neuhaus, Dirk-Holger and Munzer, Adolf, Industrial Silicon Wafer Solar Cells, Hindawi Publishing Corporation, Advances in OptoElectronics, vol. 2007, Article ID 24521, 15 Pgs.

Binns, M.J., Kommu, S., Seacrist, M.R., Standley, R.W., Wise, R., Myers, D.J., Tisserand, D. and Doyle, D., The Control of Boron Autodoping During Device Processing for P/P+ EPI Wafers with No Back-Surface Oxide Seal, MEMC Electronic Materials, Inc., 9$^{th}$ Int. Symp. Silicon Materials Science & Technology, Philadelphia, May 12-17, 2002.

Lammert, Michael D. and Schwartz, Richard J., The Interdigitated Back Contact Solar Cell: A Silicon Solar Cell for Use in Concentrated Sunlight, IEEE Transactions on Electron Devices, Ed-24, No. 4, Apr. 1977, pp. 337-342.

Mouhoub, A., Benyahia, B., Mahmoudi, and Mougas, A., Selective Emitters for Screen Printed Multicrystalline Silicon Solar Cells, Rev. Energ. Ren.: ICPWE (2003), pp. 83-86.

Debarge, L., Schott, M., Muller, J.C., Monna, R., Selective emitter formation with a single screen-printed p-doped paste deposition using out-diffusion in an RTP-step, Solar Energy Materials & Solar Cells 74 (2002), pp. 71-75.

Edwards, Matthew, Bocking, Jonathan, Cotter, Jeffrey E., and Bennett, Neil, Screen-Print Selective Diffusions for High-Efficiency Industrial Silicon Solar Cells, Progress in Photovoltaics: Research and Applications, 2008, vol. 16, pp. 31-45.

Hubbard, K.J. and Schlom, D. G., Thermodynamic stability of binary oxides in contact with silicon, Journal of Materials Research, vol. 11, Issue 11, 1996, pp. 2757-2776.

PCT Search Report.

* cited by examiner

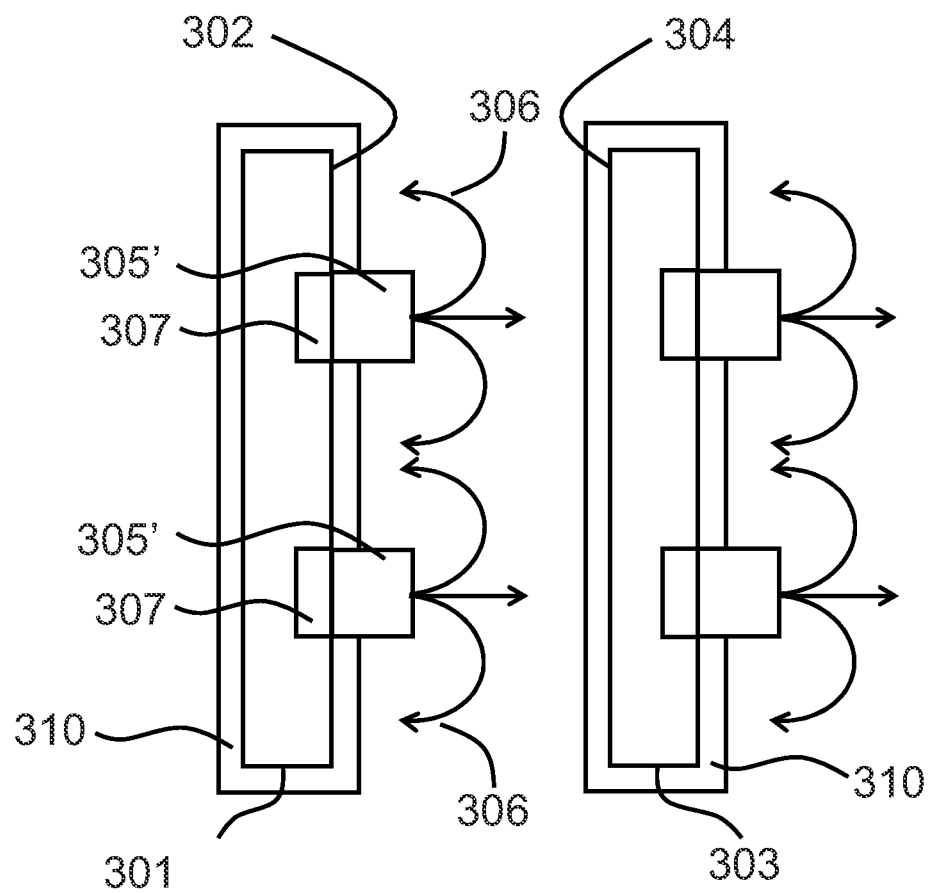

METHOD FOR MANUFACTURING A PHOTOVOLTAIC CELL WITH A LOCALLY DIFFUSED REAR SIDE

FIELD OF THE INVENTION

This disclosure relates in general to p-n junctions and in particular to methods of forming a high efficiency back-contacted solar cell employing localized boron and phosphorus diffused areas on the rear side achieved using boron and phosphorus doping pastes and an oxide barrier layer.

TECHNICAL BACKGROUND OF THE INVENTION

One approach to overcome the limitations of a conventional front-contacted solar cell is to move both the p-n junction and the back surface field (BSF) to the rear side of the solar cell. This architecture is referred to as the interdigitated back contact (IBC) solar cell. The concept of the IBC solar cell was first proposed by Lammert and Schwartz [M. D. Lammert and R. J. Schwartz, "The interdigitated back contact solar cell: a silicon solar cell for use in concentration," IEEE Translations on Electron Devices, vol. 24, no. 4, pp. 337-342, 1977].

By moving both the p-n junction and BSF to the rear, all metallization required to extract generated carriers is also moved to the rear side. The front, sunward side is therefore free from shading losses, enabling higher short circuit current and thus efficiency. The front surface no longer needs a heavily diffused layer optimized for metal contact, but instead can be optimized to create a front surface field (FSF) which minimizes recombination losses at the front surface thereby increasing the open circuit voltage and thus efficiency. Another advantage of having metal contacts on the rear side is that the metal geometry is no longer constrained to minimize shading losses, allowing for wider metal which reduces resistive losses. Having all metal contacts on the back side also has the added benefit of simplifying integration of solar cells into a module.

Various methods have been suggested with regard to the manufacturing process of the IBC cell. Such methods are described in P. J. Verlinden, R. M. Swanson and R. A. Crane, Prog. Photovolt: Res. Appl, 2, 143-152 (1994); F. Granek, "High-Efficiency Back-Contact Back-Junction Silicon Solar Cells," PhD Thesis, Fraunhofer Institute (ISE), Freiburg, Germany (2009); D-H. Neuhaus and A. Munzer, "Review Article: Industrial Silicon Wafer Solar Cells," Advances in OptoElectronics, Volume 2007, Article ID 24521, doi: 10.1155/2007/2451; US 2011/0003424; and US2010/0081264.

SUMMARY OF THE INVENTION

This invention describes a method of forming a high efficiency interdigitated back contact (IBC) solar cell employing localized boron and phosphorus diffused areas on the rear side achieved using boron and phosphorus doping pastes and an oxide barrier layer. Introducing an oxide layer prior to printing patterned doping pastes allows for simultaneous boron and phosphorus diffusion into the underlying wafer and at the same time eliminates unintended doping, referred to as autodoping, onto neighboring silicon surfaces.

An aspect of the invention is a method for manufacturing a photovoltaic cell with a locally diffused rear side, comprising steps of: (a) providing a doped silicon substrate, the substrate comprising a front, sunward facing, surface and a rear surface; (b) forming a silicon dioxide layer on the front surface and the rear surface; (c) depositing a boron-containing doping paste on the rear surface in a pattern, the boron-containing paste comprising a boron compound and a solvent; (d) depositing a phosphorus-containing doping paste on the rear surface in a pattern, the phosphorus-containing doping paste comprising a phosphorus compound and a solvent; (e) heating the silicon substrate in an ambient to a first temperature and for a first time period in order to locally diffuse boron and phosphorus into the rear surface of the silicon substrate.

BRIEF DESCRIPTION OF THE DRAWINGS

FIG. 2 schematically show autodoping associated with a patterned doping source subjected to a thermal drive-in process.

FIG. 3 schematically show a method for achieving localized doping free from autodoping using a patterned doping source and a barrier $SiO_2$ layer. FIG. 3B shows the effects of a high temperature treatment on the wafers shown in FIG. 3A.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
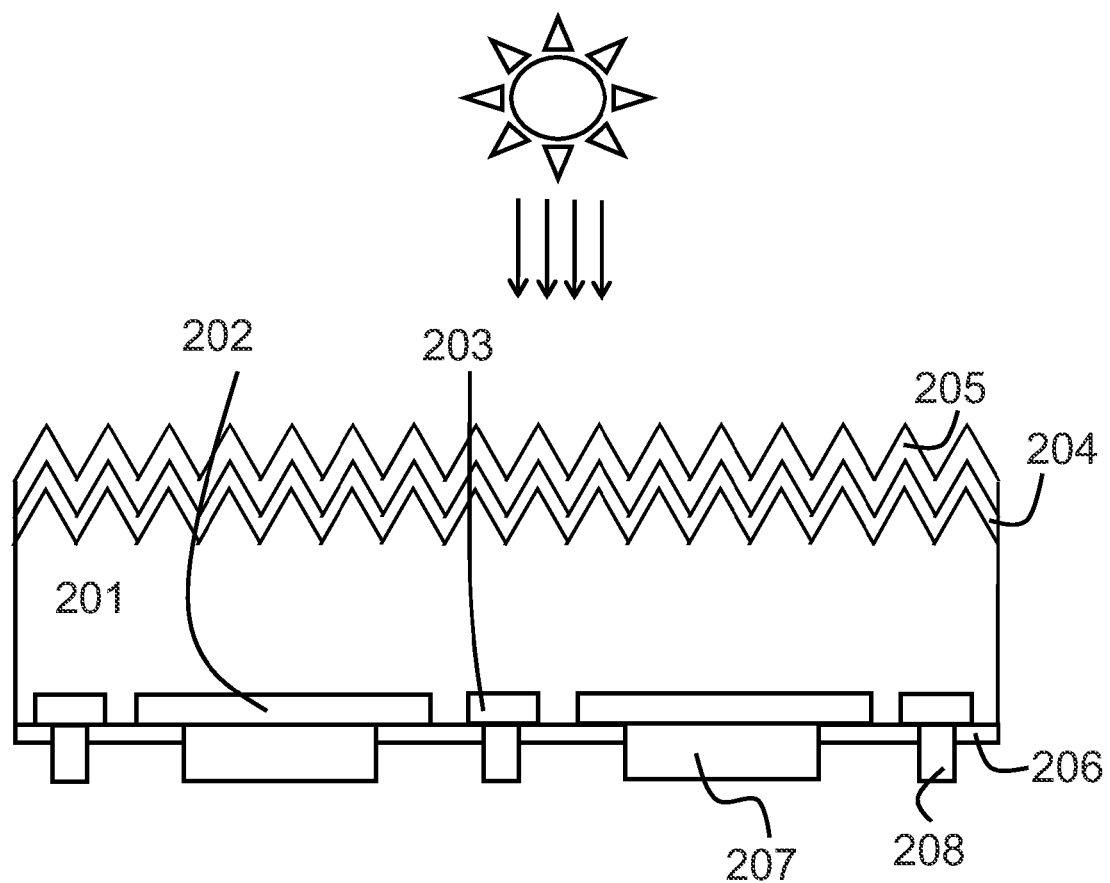
FIG. 1 shows a schematic view of an interdigitated back-contact (IBC) solar cell.

A schematic view of an interdigitated back-contact (IBC) solar cell is shown in FIG. 1. The IBC solar cell of FIG. 1 is an embodiment and the scope of the present invention is not limited to the specific type of the IBC solar cell. For example, a boron doped silicon substrate can be used instead of a phosphorus doped silicon substrate. In the embodiment of FIG. 1, a phosphorus doped silicon substrate (201) is used as the absorber. A boron emitter (202) is formed on the rear side of the cell to create the p-n junction required to separate carriers. A phosphorus BSF (203) is also formed on the rear side of the solar cell. The boron and phosphorus doped regions are formed in interdigitated patterns. A FSF (204) is formed on the front, sunward side of the solar cell, typically employing a phosphorus diffusion. The FSF repels minority carriers from the front surface thus minimizing recombination losses. The front surface is also passivated with a dielectric layer (205) which typically is a SiOx layer or SiNx layer or a SiOx/SiNx stack. The rear surface is also passivated with a dielectric layer (206) which typically is a SiOx layer or SiNx layer or a SiOx/SiNx stack. Boron emitter metal contacts (207) and BSF metal contacts (208) are formed on the rear side in order to extract generated carriers.

One approach that reduces the number of thermal steps is to screen print boron and phosphorus doping pastes in the required interdigitated pattern followed by a thermal drive-in process to transfer dopant atoms from the pastes into the underlying silicon substrate.

Achieving patterned and localized boron and phosphorus doping on a silicon wafer using boron-containing and phosphorus-containing doping pastes is made difficult by the tendency of these pastes to outgas during the thermal treatment required to diffuse dopants into the wafer. In order to diffuse boron or phosphorus from the doping pastes into the underlying silicon substrate, a thermal treatment at temperatures above 800° C. is typically used. At these elevated temperatures gaseous boron-containing and phosphorus-containing species are created from boron-containing and phosphorus-containing pastes, respectively. These gaseous species transfer onto nearby silicon surfaces, causing a spreading of dopant outside of the intended printed areas.

Gas-phase distribution of an initially patterned dopant region is called autodoping and degrades the pattern of the doped regions. Gas phase distribution and autodoping from phosphorus-containing doping pastes has been documented, for example, in [A. Mouhoub, B. Benyahia, B. Mahmoudi, and A. Mougas, "Selective Emitters for Screen Printed Multicrystalline Silicon Solar Cells," Rev. Energ. Ren.: ICPWE (2003) 83-86.; L. Debarge, M. Schott, J. C. Muller, and R. Monna, "Selective emitter formation with a single screen-printed p-doped paste deposition using out-diffusion in an RIP-step," Sol. Mat. Sol. Cells 74 (2002) 71-75; and M. Edwards, J. Bocking, J. E. Cotter, and N. Bennet, "Screen-Print Selective Diffusions for High Efficiency Industrial Silicon Solar Cells," Prog. Photovolt: Res. Appl. 16: 31-45 (2008)]. Boron autodoping has been observed from heavily doped epitaxial silicon layers which act as doping source regions for neighboring silicon wafers [M. J. Binns, S. Kommu, M. R. Seacrist, R. W. Standley, R. Wise, D. J. Myers, D. Tisserand, and D. Doyle, "The Control of Boron Autodoping during Device Processing for p/p+ Epi Wafers with no Back-Surface Oxide Seat," Proceedings from 9$^{th}$ Int. Symp. Silicon Materials Science & Technology (2002)].

Figure 2A:
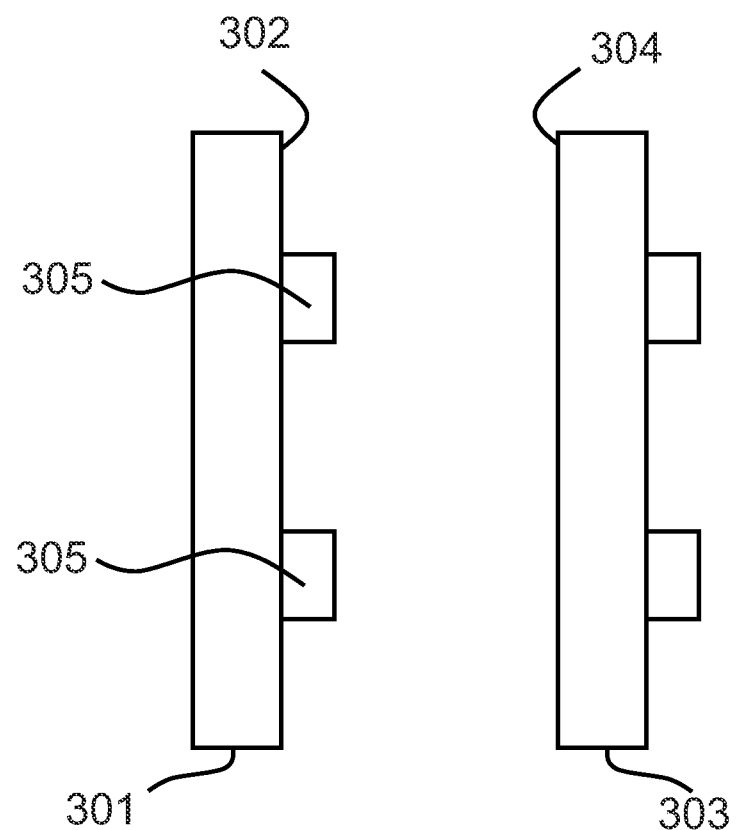
FIG. 2A shows a configuration where two silicon wafers are vertically parallel to each other.

FIG. 2 schematically shows the autodoping associated with a patterned doping source subjected to a thermal drive-in process. FIG. 3 schematically show a method for achieving localized doping free from autodoping using a patterned doping source and a barrier SiO$_2$ layer, FIG. 2A shows two silicon wafers (301) and (303) vertically parallel to each other representing the typical orientation used when processing wafers inside a quartz furnace. The rear surface (302) of wafer (301) is adjacent to the front side (304) of wafer (303). Also shown in FIG. 2A are patterned doping source regions (305) which can be either boron or phosphorus paste. When subjected to high temperature treatment, the doping source regions are intended to create localized doping of the underlying silicon substrate, i.e. dopant atoms are to be introduced into the substrate only in areas directly underneath the doping source.

Figure 2B:
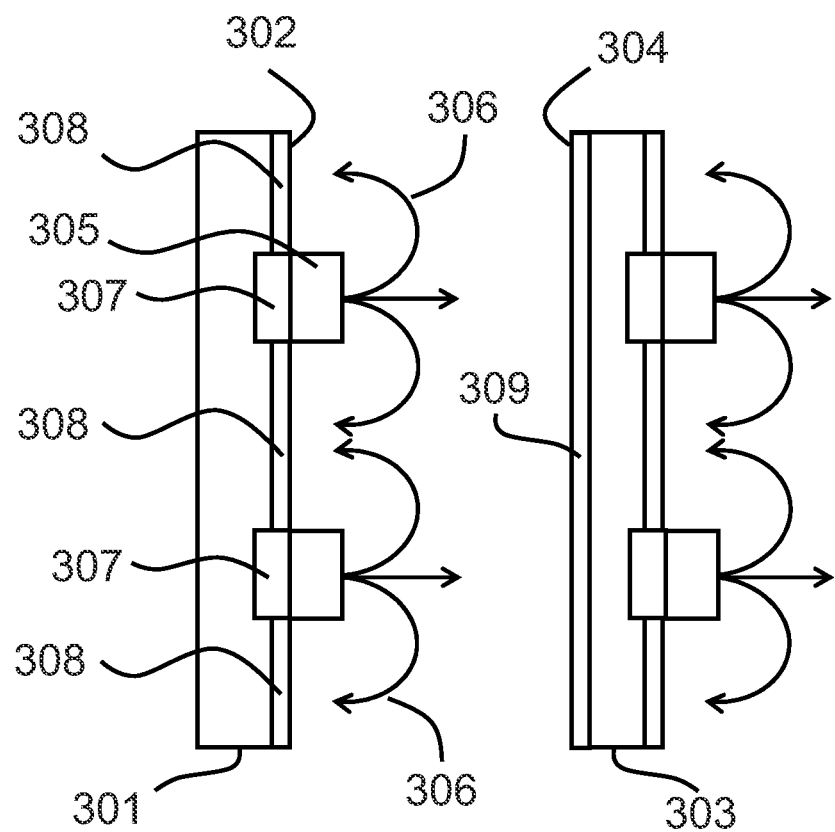
FIG. 2B shows the effects of a high temperature treatment on the wafers shown in FIG. 2A.

FIG. 2B shows the effects of a high temperature treatment on the wafers shown in FIG. 2A. Wafers (301) and (303) are subjected to a high temperature drive-in step, typically 800° C. or higher, in order to drive dopant atoms from the doping pastes into the underlying silicon substrate forming doped areas (307) directly beneath the doping sources. At these elevated temperatures, dopant species (306) transfer from the doping source regions (305) onto the rear surface (302) of the underlying wafer (301) as well as onto the front side (304) of the neighboring wafer (303). The transfer of dopant species (306) results in unintended doping, referred to as autodoping, creating a doped layer (308) on the rear side (302) of the underlying wafer as well as creating a doped layer (309) on the front side of the neighboring wafer (303). Autodoping results in the loss of the localized doping.

Maintaining localized doping and eliminating autodoping can be achieved by introducing a protective SiO$_2$ layer on the silicon wafer surface prior to applying a patterned doping source layer.

Figure 3A:
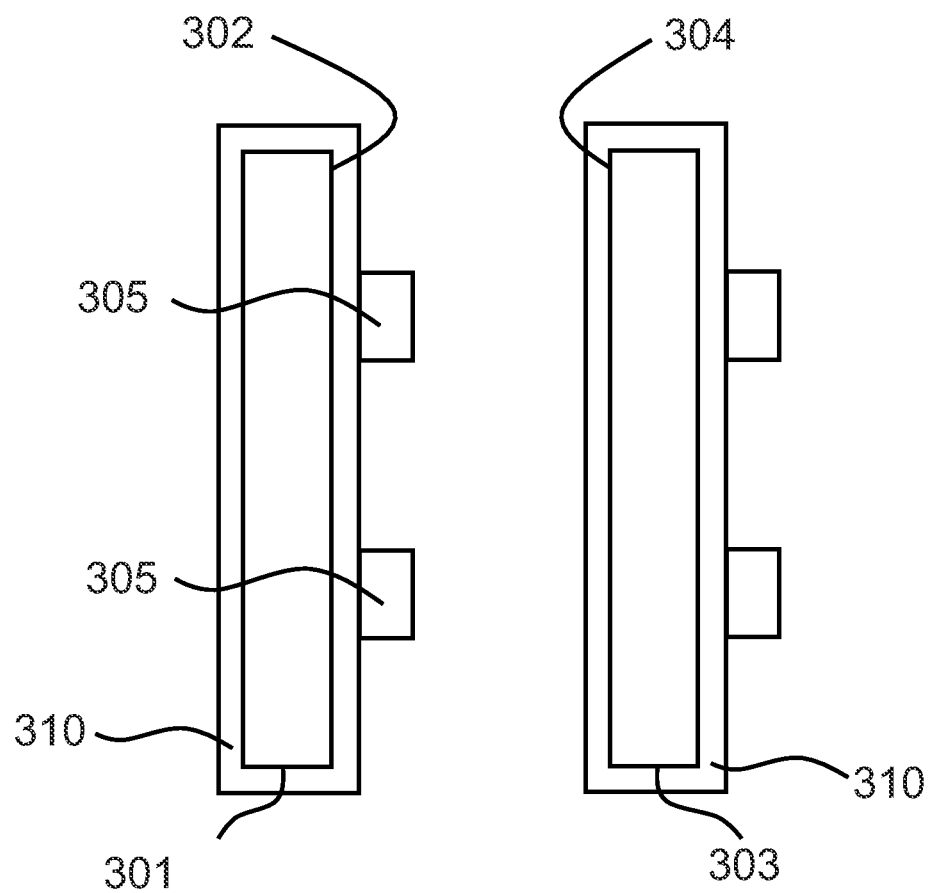
FIG. 3A shows two silicon wafers (301) and (303) with $SiO_2$ layer (310) in the same configuration as the wafers in FIG. 2A.

FIG. 3 shows two silicon wafers (301) and (303) in the same configuration as the wafers in FIG. 2A, but with each wafer having all surfaces covered with a SiO$_2$ layer (310). The rear surface (302) of wafer (301) is adjacent to the front side (304) of wafer (303). Also shown in FIG. 3A are patterned doping source regions (305) which are separated from the rear surface (302) by the SiO$_2$ layer (310). The doping sources (305) can be either boron or phosphorus pastes.

FIG. 3B shows the effects of a high temperature treatment on the wafers shown in FIG. 3A. Wafers (301) and (303) are subjected to a high temperature drive-in step, typically 800° C. or higher. The doping source regions (labeled as (305) in FIG. 3A) locally react with the underlying SiO$_2$ creating new doping source layers (305'). The doping source layers (305') make contact with the underlying silicon water surface. Dopant atoms are driven from the doping source layers (305') into the underlying wafer, creating localized doped areas (307).

At these elevated temperatures dopant species (306) transfer from the doping source regions (305') onto the SiO$_2$ layer (310) covering the rear surface (302) of the underlying wafer (301) as well as onto the SiO$_2$ layer (310) covering the front side (304) of the neighboring wafer (303). The SiO$_2$ layer (310) acts as a barrier for areas not covered with the dopant source layer (305'), preventing dopant species (306) from reaching the front surface (302) of the underlying wafer (301) as well as onto the rear side (304) of the neighboring wafer (303). The SiO_layer (310) enables localized doping and eliminates autodoping.

An embodiment for incorporating the doping-through-oxide approach to fabricate an IBC solar cell is shown in FIGS. 4A-4I.

Figure 4A:
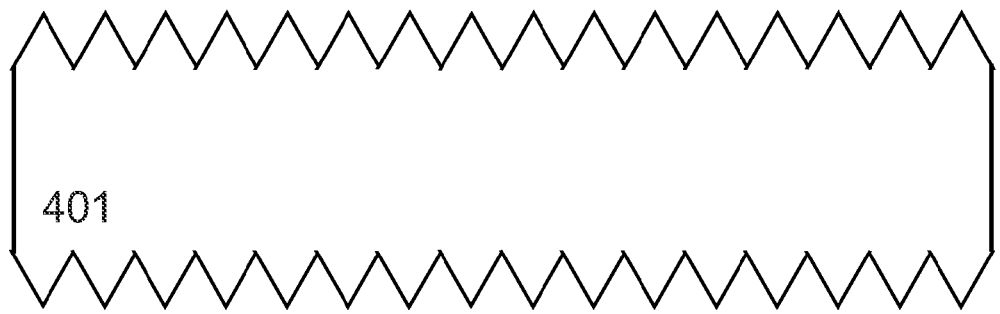
FIG. 4 shows a process for incorporating the doping-through-oxide approach to fabricate an IBC solar cell.
Figure 4B:
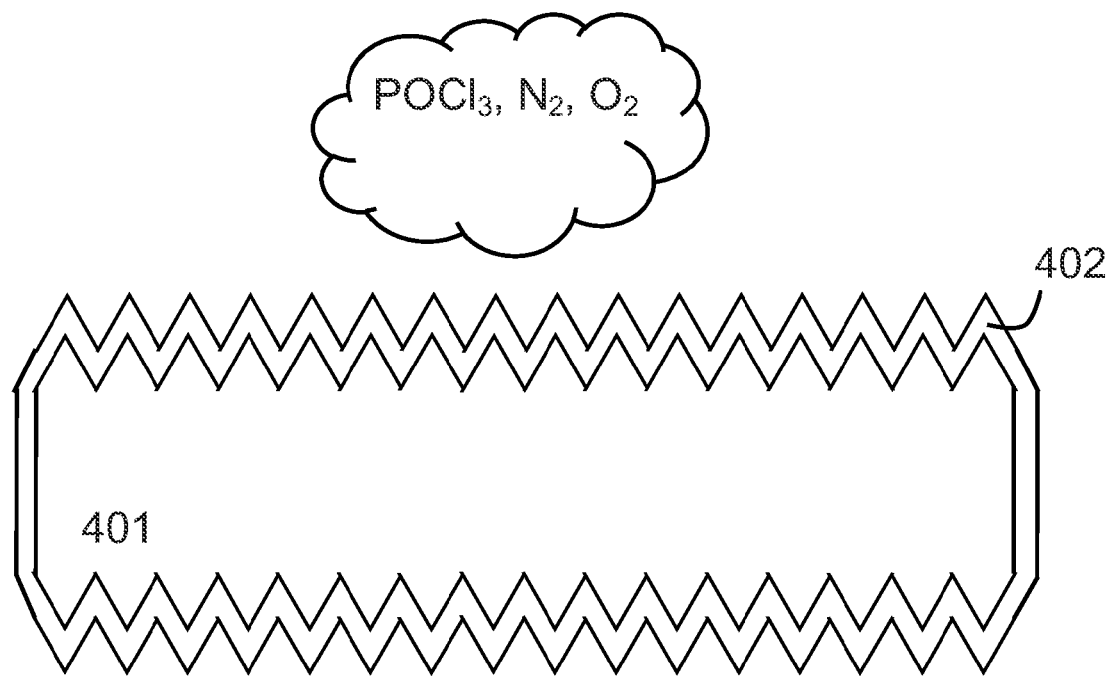

The fabrication process may begin with a textured n-type silicon wafer (401) as shown in FIG. 4A. The silicon wafer is then subjected to a phosphorus diffusion process, like a POCl$_3$ diffusion process performed in a heated quartz tube furnace in a POCl$_3$, N$_2$ and O$_2$ ambient, forming an n+ layer (402) near the wafer surface as shown in FIG. 4B. Residual surface phosphosilicate glass from the phosphorus diffusion can be removed by submerging the wafer in a dilute HF solution.

Figure 4C:
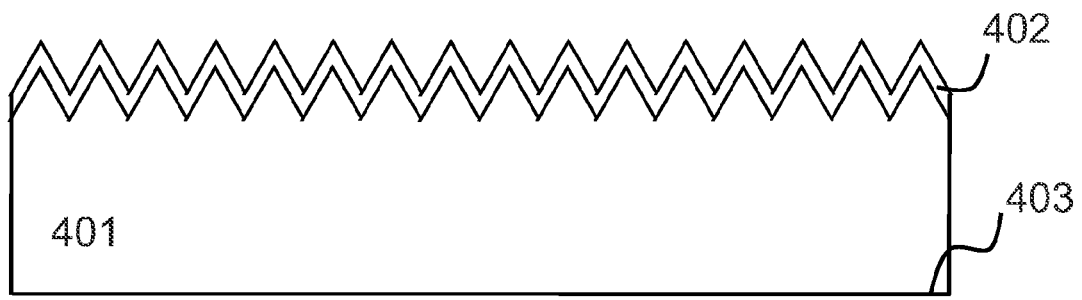
Figure 4D:
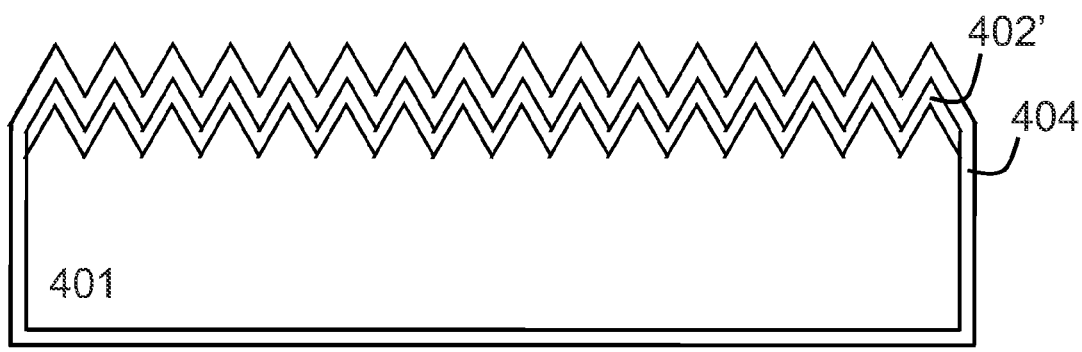

The rear side phosphorus diffused layer can be removed using a single-sided wet chemistry etch process using a hydrofluoric acid, nitric acid, and sulfuric acid mixture, leaving behind an n-type rear surface (403) as shown in FIG. 4C. The wafer is then subjected to an oxidation process which grows a $SiO_2$ layer (404) on the surface of the wafer as shown in FIG. 4D. A thermal oxidation process may be used which typically employs a heated quartz tube furnace with an oxidizing ambient. This high temperature oxidation step will at the same time drive the phosphorus atoms in the existing front side n+ layer (shown as (402) in FIG. 4C) deeper into the wafer, thus creating a modified n+ layer shown as (402') in FIG. 4D. In the event a boron-doped substrate is used as the substrate (401), the doped layer (402 in FIG. 4C), which is doped with the same dopant as the dopant of the substrate 401, can be a p+ layer.

Alternatively, the oxide layer (404) may be formed by other methods such as (i) thermal oxidation, (ii) printing and drying a composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer. In the cases of growing a chemical oxide or growing and oxidizing a porous silicon layer, the top heavily doped portion (closest to the wafer surface) of the existing front side n+ layer (shown as (402) in FIG. 4C) may be etched away thus creating a modified n+ layer similar to that achieved using a thermal drive-in process (shown as (402') in FIG. 4D). The thickness of the $SiO_2$ layer is 10 nm to 100 in an embodiment.

Figure 4E:
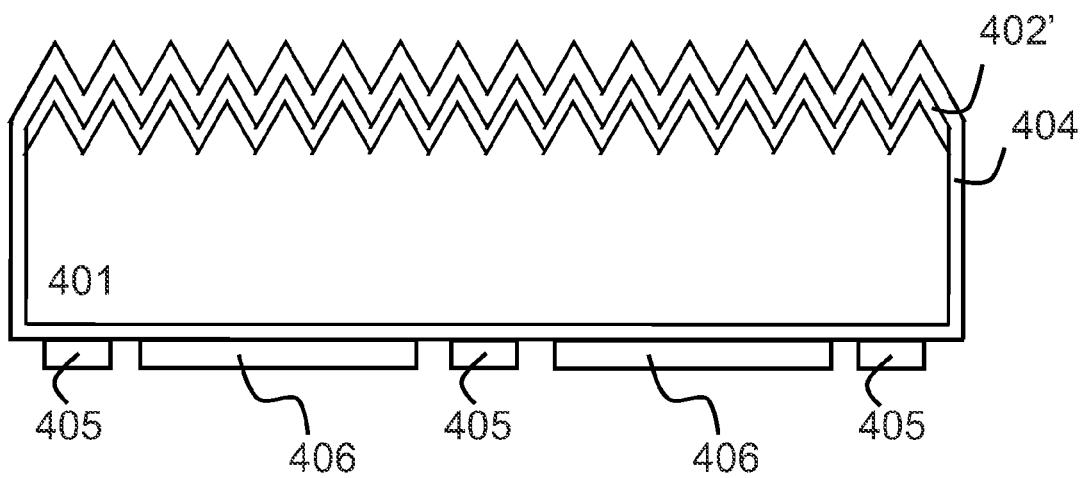

For the next step, shown in FIG. 4E, a phosphorus-containing paste is screen printed onto the oxidized rear surface followed by a low temperature bake in order to drive off solvents from the paste to form a patterned phosphorus-containing paste area (405). A boron-containing doping paste is then screen printed onto the oxidized rear surface followed by a low temperature bake in order to drive off solvents to form a patterned boron-containing paste area (406). The order of depositing the doping pastes is interchangeable, in an embodiment, both pastes are printed at the same time. Other methods can be used for depositing the pastes instead of screen printing. The phosphorus-containing paste and the boron-containing paste may be baked together in an embodiment. The boron and phosphorus prints will form an interdigitated pattern which after a thermal drive-in process will create the boron emitter and phosphorus BSF.

Figure 4F:
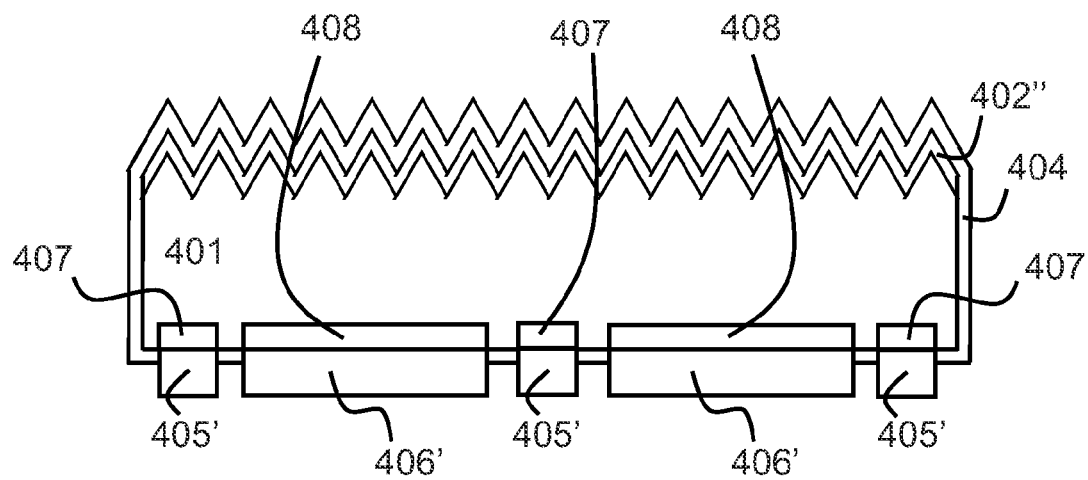

The oxidized rear surface does not contain any via or any through hole that enables the direct contact of the pastes with the rear surface (403) of the substrate in an embodiment. As illustrated in FIG. 4F, the boron-containing paste and the phosphorus-containing paste are deposited on the $SiO_2$ layer and the boron and phosphorus diffuses into the silicon wafer in the following drive-in process.

The next step is a high temperature drive-in process. The process is performed in a quartz tube furnace in an $N_2$ ambient in an embodiment. During this high temperature step both the boron and phosphorus pastes locally react with oxide layer forming new boron source layers (406') and new phosphorus source layers (405') which reach the underlying silicon wafer and locally dope to form the boron emitter (408) and the phosphorus BST (407) as shown in FIG. 4F.

The temperature of the drive-in process is 850° C. to 1000° C. in an embodiment. The time period of the drive-in process is 20 minutes to 2 hours in an embodiment.

This high temperature drive-in step can at the same time drive the phosphorus atoms in the existing front side n+ layer (shown as (402') in FIGS. 4D and 4E) deeper into the wafer thus creating a modified n+ layer shown as (402") in FIG. 4F in an embodiment. This modified n+ layer (402") is the FSF.

Figure 4G:
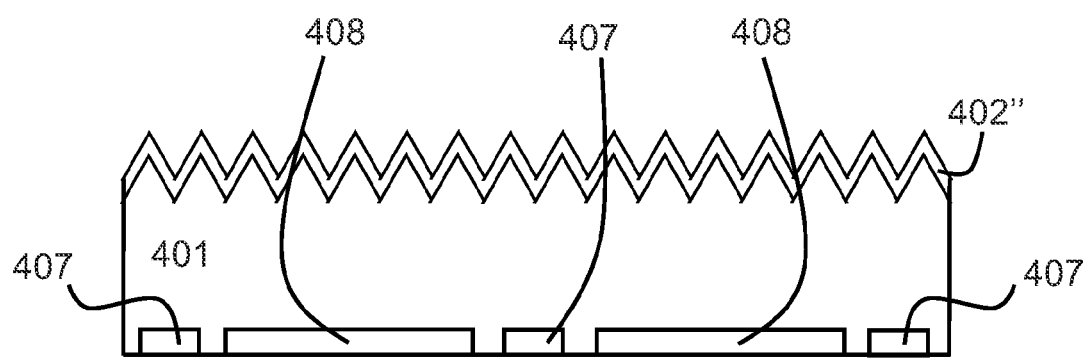

The next step is to remove the oxide layer and residual paste layers exposing the FSF (402") on the front side and the boron emitter (408) and phosphorus BSF (407) on the rear side as shown in FIG. 4G. The oxide layer can be removed by submerging the wafers in a dilute HF solution.

Figure 4H:
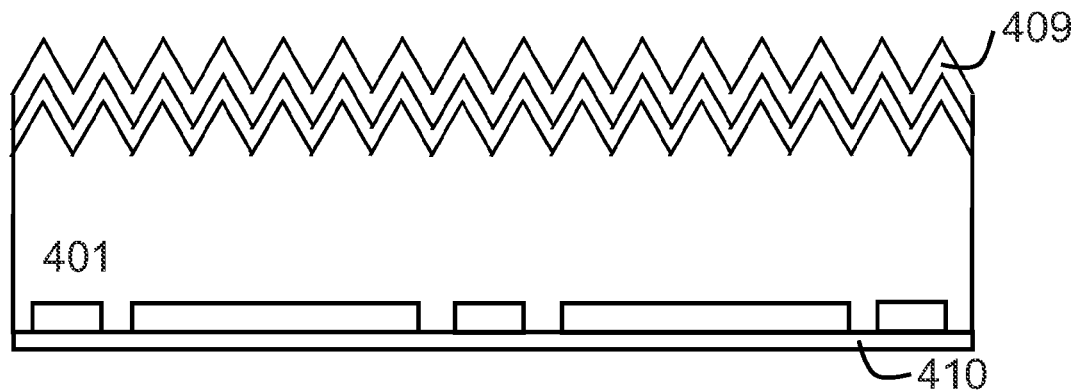

The front and rear surfaces are subsequently coated with passivation layers (409) and (410), respectively, as shown in FIG. 4H. These layers can be for example SiOx, SiNx, or a SiOx/SiNx stack.

Figure 4I:
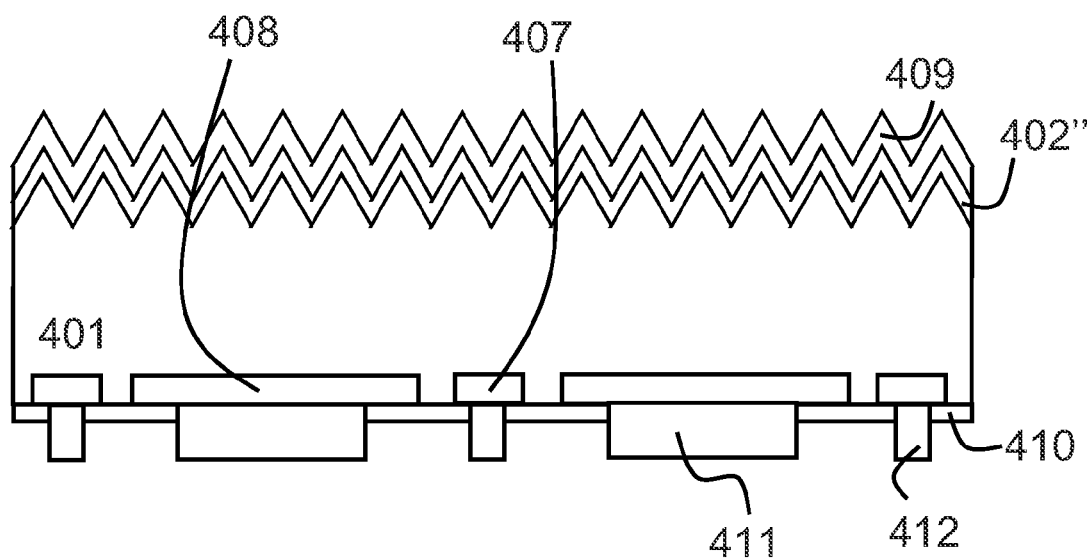

The final step is to apply boron emitter metal contacts (411) and phosphorus BSF contacts (412), as shown in FIG. 4I. The metal contacts can either directly contact the diffused regions, referred to as line contacts, or can locally contact the diffused regions through openings made in the passivation layers, referred to as point contacts.

Another embodiment for incorporating the doping-through-oxide approach to fabricate an IBC solar cell is shown in FIGS. 5A-I.

Figure 5A:
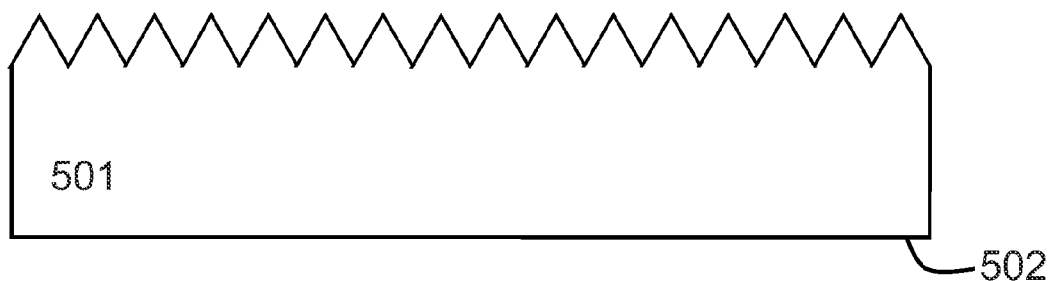
FIG. 5 shows an alternative process for incorporating the doping-through-oxide approach to fabricate an IBC solar cell.
Figure 5B:
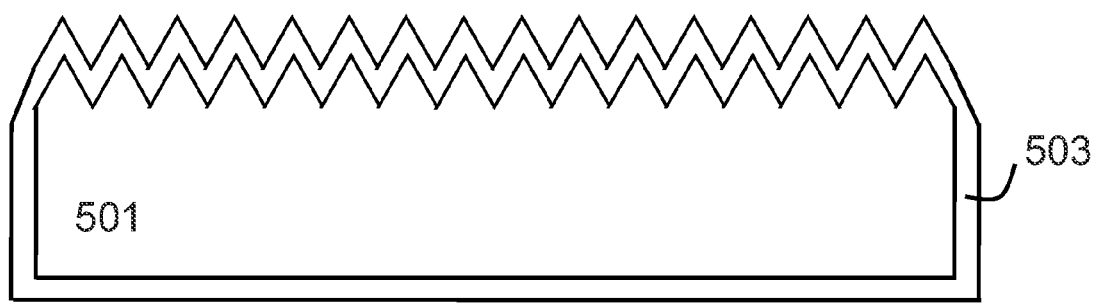

The fabrication process may begin with a textured n-type silicon wafer (501) with a rear surface (502) as shown in FIG. 5A. The rear surface (502) can either be flat or textured. The wafer is then subjected to an oxidation process which grows a $SiO_2$ layer (503) on the surface of the wafer as shown in FIG. 5B. A thermal oxidation process may be used which typically employs a heated quartz tube furnace with an oxidizing ambient.

Alternatively, the oxide layer (503) may be formed by other methods such as (i) thermal oxidation, (ii) printing and drying a composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer. The thickness of the $SiO_2$ layer is 10 nm to 100 nm in an embodiment.

Figure 5C:
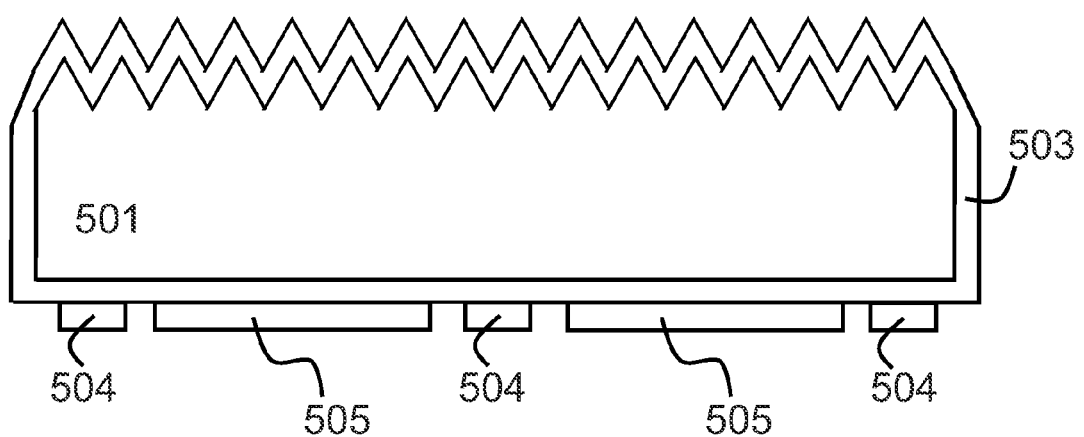

For the next step, shown in FIG. 5C, a phosphorus-containing paste is screen printed onto the oxidized rear surface followed by a low temperature bake in order to drive off solvents from the paste to form a patterned phosphorus-containing paste area (504). A boron-containing doping paste is then screen printed onto the oxidized rear surface followed by a low temperature bake in order to drive off solvents to form a patterned boron-containing paste area (505). The order of depositing the doping pastes is interchangeable. In an embodiment, both pastes are printed at the same time. Other methods can be used for depositing the pastes instead of screen printing. The phosphorus-containing paste and the boron-containing paste may be baked together in an embodiment. The boron and phosphorus prints will form an interdigitated pattern which after a thermal drive-in process will create the boron emitter and phosphorus BSF.

The oxidized rear surface does not contain any via or any through hole that enables the direct contact of the pastes with the rear surface (502) of the substrate in an embodiment. As illustrated in FIG. 5C, the boron-containing paste and the phosphorus-containing paste are deposited on the $SiO_2$ layer and the boron and phosphor diffuses into the silicon wafer in the following drive-in process.

Figure 5D:
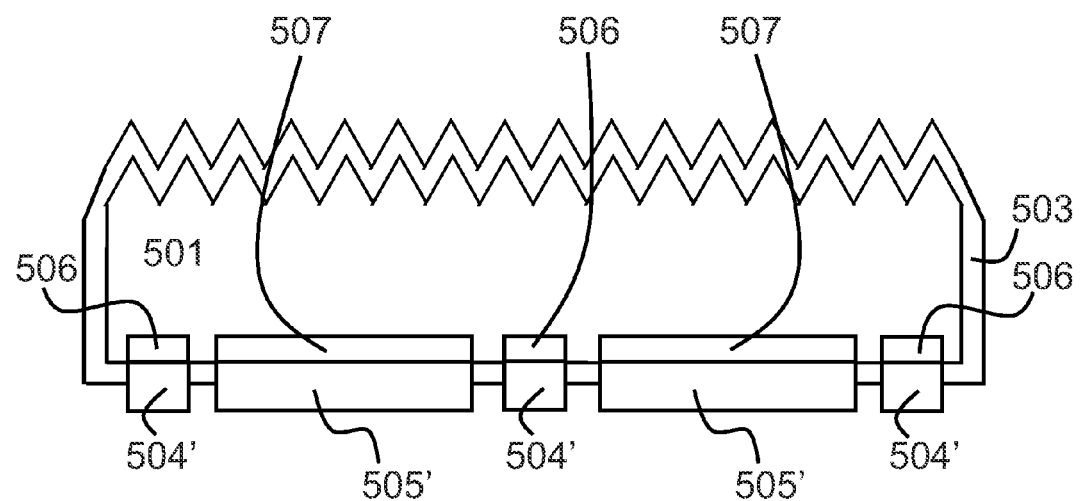

The next step is a high temperature drive-in process. The process is performed in a quartz tube furnace in an $N_2$ ambient in an embodiment. During this high temperature step both the boron and phosphorus pastes locally react with oxide layer forming new boron source layers (505') and new phosphorus source layers (504') which reach the underlying silicon wafer and locally dope to form the boron emitter (507) and the phosphorus BSF (506) as shown in FIG. 5D.

The temperature of the drive-in process is 850° C. to 1000° C. in an embodiment. The time period of the drive-in process is 20 minutes to 2 hours in an embodiment.

Figure 5E:
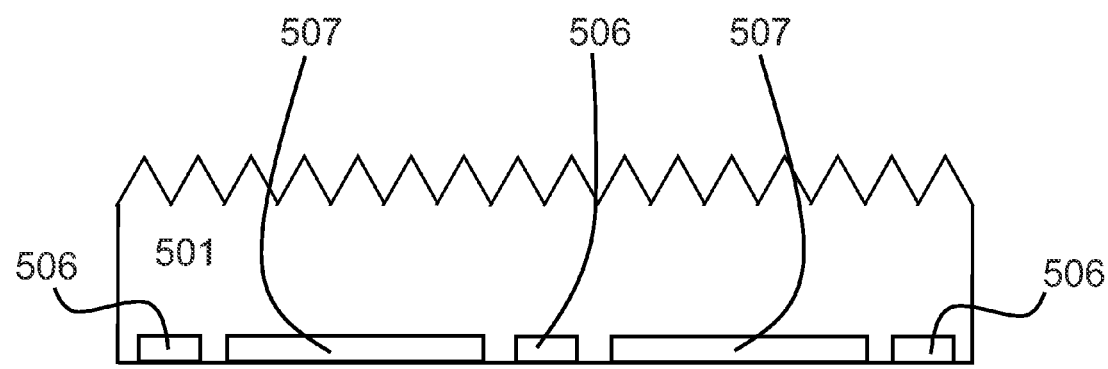

The next step is to remove the oxide layer and residual paste layers exposing the boron emitter (507) and phosphorus BSF (506) on the rear side as shown in FIG. 5E. The oxide layer can be removed by submerging the wafers in a dilute HF solution.

Figure 5F:
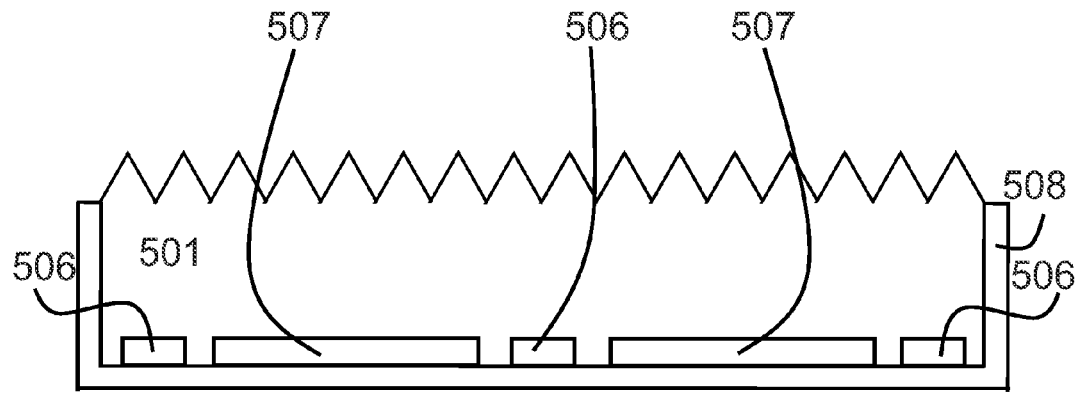
Figure 5G:
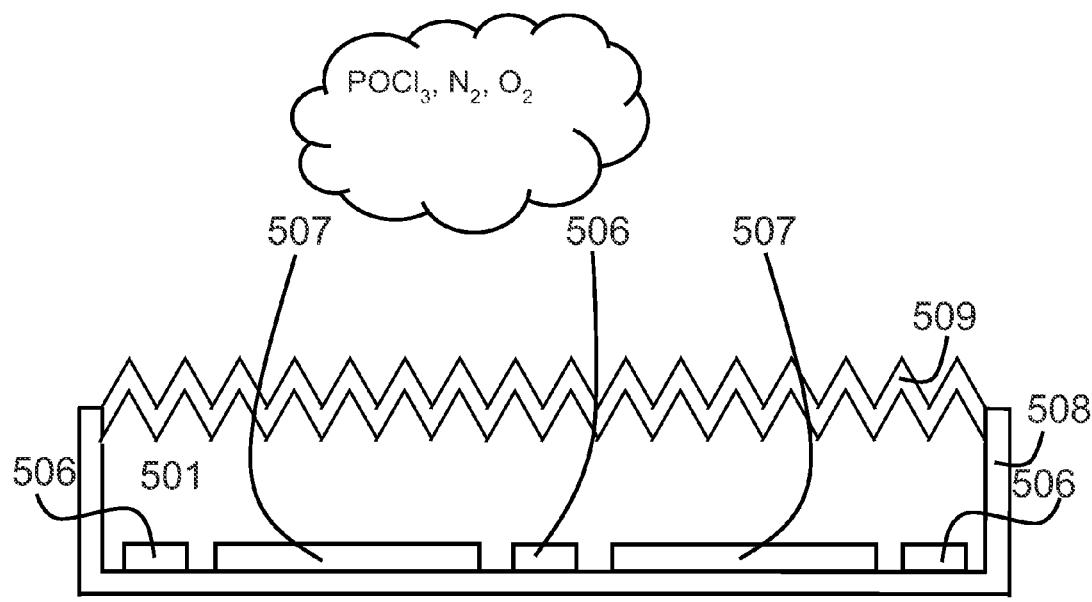
Figure 5H:
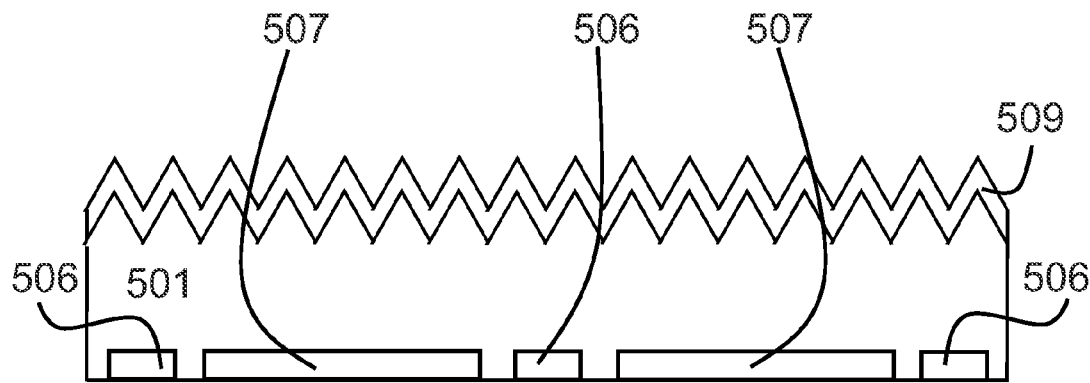

The rear side of the wafer is then covered with a masking layer (508) as shown in FIG. 5F. The masking layer will serve as a diffusion barrier layer and may be made of $SiO_2$. The masking layer can be formed by methods such as chemical vapor deposition, screen printing a silicon dioxide containing paste or spin coating a silicon dioxide containing liquid. The silicon wafer is then subjected to a phosphorus diffusion process, like a $POCl_3$ diffusion process performed in a heated quartz tube furnace in a $POCl_3$, $N_2$ and $O_2$ ambient, forming an n+ layer (509) on the wafer surface as shown in FIG. 5G. This n+ layer is the FSF. The masking layer (508) and residual surface phosphosilicate glass from the phosphorus diffusion can be removed by submerging the wafer in a dilute HF solution exposing the FSF (509), the boron emitter (507), and the phosphorus BSF (506) as shown in FIG. 5H. In the event a boron-doped substrate is used as the substrate (501), the doped layer (509 in FIG. 5G), which is doped with the same dopant as the dopant of the substrate 501, can be a p+ layer.

The front and rear surfaces are subsequently coated with passivation layers (510) and (511), respectively. These layers can be for example SiOx, SiNx, or a SiOx/SiNx stack.

Figure 5I:
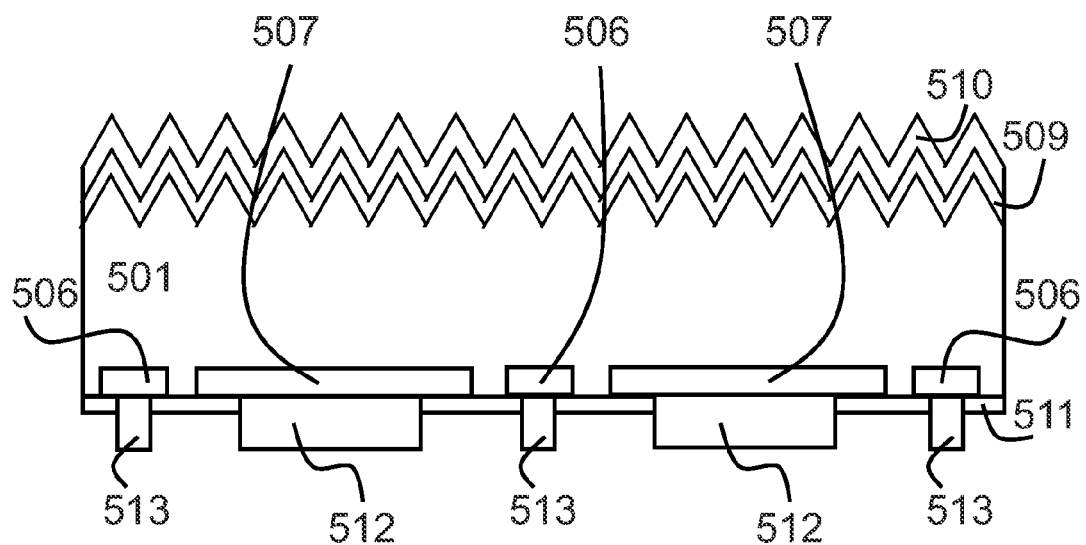

The final step is to apply boron emitter metal contacts (512) and phosphorus BSF contacts (513), as shown in FIG. 5I. The metal contacts can either directly contact the diffused regions, referred to as line contacts, or can locally contact the diffused regions through openings made in the passivation layers, referred to as point contacts.

There are several methods of depositing the boron-containing paste and phosphorus-containing paste. Screen printing, in particular, is beneficial for the deposition of the paste since it is commonly used in solar cell manufacturing for the deposition of front and rear metal pastes. For the better printing efficiency and performance, the paste is preferred to be a non-Newtonian or shear-thinning fluid.

Non-Newtonian fluid refers to a fluid that has flow properties that are not described by a single constant value of viscosity, or resistance to flow. Shear thinning refers to a fluid which has a viscosity that decreases with increasing rate of shear. In general, shear thinning behavior is observed in colloidal suspensions, where the weak hydrostatic and electrostatic interaction between particles and their surface groups tends to increase viscosity in non-dynamic force regimes. The addition of a relatively small shear force overcomes the hydrostatic interaction and thus tends to reduce the viscosity of the fluid.

Consequently, the viscosity of the paste is preferred to be relatively low at high shear rates in order to pass through a screen pattern, but is also preferred to be relatively high prior to and after deposition (at low or zero shear rates), such that the paste will not run through the screen or on the substrate surface respectively.

Boron-containing paste comprises a boron compound; a polymer binder; a solvent, and optionally a ceramic compound. Phosphorus-containing paste comprises a phosphorus compound; a polymer binder; a solvent; and optionally a ceramic compound.

The boron compound includes, but not limited to, boron (B), boron nitride (RN), boron oxide ($B_2O_3$), boric acid ($B(OH)_3$), boron carbide ($B_4C$), boron silicide ($B_2Si$; $B_3Si$, $B_4Si$, $B_6Si$), boron-doped group IV nanoparticles (such as nc-Si:B), aluminum boride ($AlB_2$), barium boride ($BaB_6$), calcium boride ($CaB_6$), cerium boride ($CeB_6$), chromium boride (CrB), cobalt boride ($Co_2B$—$Co_3B$), dysprosium boride ($DyB_4$, $DyB_6$), erbium boride ($ErB_4$), europium boride ($EuB_6$), gadolinium boride ($GdB_6$), hafnium boride ($HfB_2$), holmium boride ($HoB_4$), iron boride ($Fe_2B$), lanthanum boride ($LaB_6$), lutetium boride ($LuB_4$), magnesium boride ($MgB_2$), manganese boride (MnB, $MnB_2$), molybdenum boride (MoB), neodymium boride ($NdB_6$), nickel boride (NiB), niobium boride ($NbB_2$), praseodymium boride ($PrB_6$), rhenium boride ($Re_7B_3$), samarium boride ($SmB_6$, scandium boride ($ScB_2$), strontium boride ($SrB_6$), tantalum boride ($TaB_2$), terbium boride ($TbB_6$), thulium boride ($TmB_4$), titanium boride ($TiB_2$), tungsten boride (WB, $W_2B$, $W_2B_5$), vanadium boride ($VB_2$), ytterbium boride ($YbB_6$), and zirconium boride ($ZrB_2$, $ZrB_{12}$).

The boron compound is between 0.5 and 50 wt % in an embodiment, and between 1 and 10 wt % in another embodiment, based on the total weight of the paste.

The phosphorus compound includes, but not limited to, salts of linear phosphoric acids $H(O—PO(OH))_nOH$, where $n \geq 1$, and amount of substitutent cations $X \leq n+2$; salts of cyclic phosphoric acids $(O—PO(OH))_n$, where $n \geq 3$, and amount of substitutent cations $X \leq n$, mono- and di-substituted salts of phosphorus acid $HPO(OH)_2$, and salt of hypophosphorus acid $H_2PO(OH)$; and substitutent cations X are ammonium, its organic derivatives, and metal cations, preferably Al, Ba, Ca, Ce, Mg, Hf, Ta, Ti, Zr, La.

The phosphorus compound is between 20 and 90 wt % in an embodiment, and between 40 and 70 wt % in another embodiment, based on the total weight of the paste.

A ceramic compound may be included in the paste. During the high temperature diffusion process, boron and phosphorus are allowed to diffuse into the substrate, while the diffusion of ambient materials may be blocked or substantially reduced by the ceramic material. In an embodiment, the ceramic compound is selected in terms of compatibility with the silicon substrate. Some of the oxide materials in contact with silicon at an elevated temperature may get reduced introducing impurities into the wafer.

The ceramic compound include, but not limited to, SiN, $SiO_2$, SiC, $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$ and $HfO_2$. In an embodiment, the ceramic compound is selected from the group consisting of titanium oxide ($TiO_2$), aluminum oxide ($Al_2O_3$), magnesium oxide (MgO), tantalum oxide ($Ta_2O_3$), and zirconium oxide ($ZrO_2$), and combinations thereof.

In an alternate configuration, the particle surface of the ceramic compound may be treated with a ligand or capping agent in order to disperse in a set of solvents and optimize shear thinning behavior. In general, a capping agent or ligand is a set of atoms or groups of atoms bound to a "central atom" in a polyatomic molecular entity. The capping agent is selected for some property or function not possessed by the underlying surface to which it may be attached.

For the selection and modification of the ceramic compound, publicly available paper such as K. J. Hubbard and D. G. Schlom, Thermodynamic stability of binary metal oxides in contact with Silicon, J. Mater. Research, v 11(11), 1996) and prior patent application such as U.S. Utility patent application Ser. No. 13/099,794 filed on May 3, 2011 can be referred to.

The ceramic compound is between 0 and 50 wt % in an embodiment, between 3 and 40 wt % in another embodiment, 5 and 30 wt % in still another embodiment, based on the total weight of the paste.

A polymer binder may be included in the paste in order to optimize viscoelastic behavior of the paste for screen printing. The polymer binder includes, but is not limited to, polyacrylates, polymethacrylate, polyacetals and their derivatives (e.g. methy, ethyl, butyl), polyvinyls, a cellulose (including its ethers and esters), and copolymers thereof. Two or more types of the polymer binder can be used in mixture.

The polymer binder is between 0.5 and 10 wt % in an embodiment, between 0.5 and 3 wt % in another embodiment, and between 0.75 and 2 wt % in still another embodiment, based on the total weight of the paste.

The component of the paste can be dispersed in a solvent, such as alcohols (e.g. terpineol), aldehydes, ketones (e.g. cyclohexanone), carboxylic acids, esters, amines, organosiloxanes, halogenated hydrocarbons, and other hydrocarbon solvents. In addition, the set of solvents may be mixed in order to optimize physical characteristics such as viscosity, density, polarity, etc.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

EXAMPLES

Experiment 1

A set of 156 mm pseudo square, 180 micron thick, p-type, 2 Ohm-cm silicon wafers were oxidized in a quartz furnace at 1000C in an oxidizing ambient for 60 minutes creating an oxide layer of approximately 80 nm on both sides of the wafers. The oxidized wafers were screen printed with various boron-containing pastes. The pastes were printed in a pattern composed of paste areas and non-paste areas.

The boron-containing pastes were composed of a boron compound as dopant source, a ceramic compound as matrix material, a polymer binder and a solvent. The formulations of Table 1 were investigated. Poly(butyl methacrylate), referred to as PBMA, was used as the polymer binder, and Terpineol:Cyclohexanone (95 wt %:5 wt %), referred to as TOH:CHO=95:5, was used as the solvent.

TABLE 1

| Paste | Dopant | Matrix | Binder | Solvent |
|---|---|---|---|---|
| A | $B_6Si$ (5 wt %) | $ZrO_2$ (39.7 wt %) | PBMA (3.8 wt %) | TOH:CHO = 95:5 (51.5 wt %) |
| B | Boric Acid (BA) (10 wt %) | $Ta_2O_5$ (51.6 wt %) | PBMA (2.6 wt %) | TOH:CHO = 95:5 (35.8 wt %) |
| C | Boron Carbide (10 wt %) | $SiO_2$ (6.2 wt %) | PBMA (2.8 wt %) | TOH:CHO = 95:5 (81 wt %) |
| D | Boron Carbide (3 wt %) | $Ta_2O_5$ (47.4 wt %) | PBMA (3.3 wt %) | TOH:CHO = 95:5 (46.3 wt %) |
| E | Boron Carbide (2 wt %) | $ZrO_2$ (38.9 wt %) | PBMA (4.1 wt %) | TOH:CHO = 95:5 (55 wt %) |

Printed wafers were subsequently baked in air at 170° C. for approximately 1 minute. The wafers were then loaded into a quartz tube furnace and subjected to a drive-in process at 925° C. for 1 hour in an $N_2$ ambient. The wafers were then dipped in a dilute hydrofluoric acid solution to remove the oxide layer. Any residual paste was removed using an ultrasonic water clean for 6 minutes. Doping in the paste and non-paste areas was verified by performing four point probe measurements in those areas.

Figure 6:
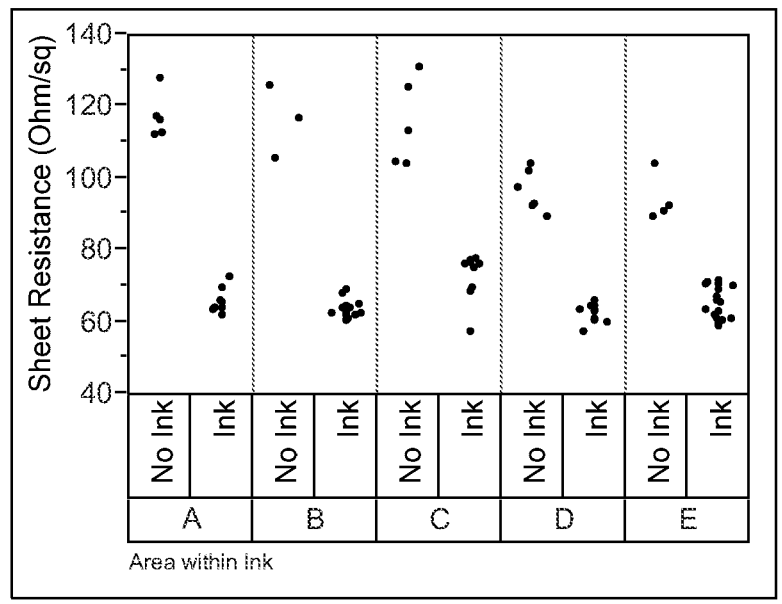
FIG. 6 shows sheet resistance results for Ink (Paste) and No Ink (No Paste) areas on an 80 nm oxide barrier layer after a 925° C. thermal process.

The result is shown in FIG. 6. Average values from left to right were 118, 66, 116, 64, 116, 73, 97, 62, 95, 65 Ohm/sq. As shown in the figure, heavy boron diffusions in the paste regions are achieved for all paste formulations. For pastes A-E, the sheet resistance in the non-paste areas is significantly higher indicating that localized boron doping was achieved.

Experiment 2

In order to assess the effect of the thickness of the oxide layer, the same experiments as Experiment 1 was conducted except that the thickness of the oxide layer was reduced to 50 nm. A set of 156 mm pseudo square, 180 micron thick, p-type, 2 Ohm-cm silicon wafers were oxidized in a quartz furnace at 1000C in an oxidizing ambient for 30 minutes creating an oxide layer of approximately 50 nm on both sides of the wafers. The oxidized wafers were screen printed with the paste formulations listed in Table 1.

Figure 7:
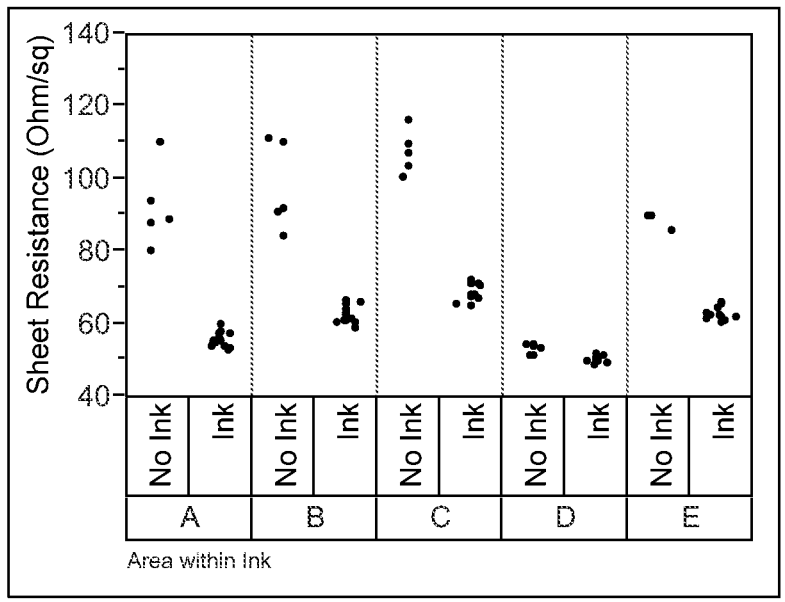
FIG. 7 shows sheet resistance results for Ink (Paste) and No Ink (No Paste) areas on a 50 nm oxide barrier layer after a 925° C. thermal process.

The results are shown in FIG. 7. Average values from left to right were 93, 56, 98, 63, 108, 69, 53, 50, 89, 64 Ohm/sq. As shown in the figure, heavy boron diffusions in the paste regions are achieved for all paste formulations. For pastes A, B, C, and E the sheet resistance in the non-paste areas is significantly higher indicating that localized boron doping was achieved. For paste D heavy diffusion (low sheet resistance) is achieved in the non-paste areas indicating that autodoping was not significantly suppressed. FIGS. 6 and 7 demonstrate that the autodoping suppression can be controlled via oxide layer thickness.

Experiment 3

A set of 156 mm pseudo square, 180 micron thick, p-type, 2 Ohm-cm silicon wafers were oxidized in a quartz furnace at 1000C in an oxidizing ambient for 30 minutes creating an oxide layer of approximately 50 nm on both sides of the wafers. The oxidized wafers were sequentially printed and baked to form an alternating pattern of boron-containing paste, non-paste, and phosphorus-containing paste regions. The formulations of Table 2 were investigated. Poly(butyl methacrylate), referred to as PBMA, was used as the polymer binder, and Terpineol:Cyclohexanol (95 wt %:5 wt %), referred to as TOH:CHO=95:5, was used as the solvent.

The oxidized wafers were screen printed with boron paste F with an alternating pattern of 14 mm×14 mm patches and non-printed areas. Printed wafers were subsequently baked in air at 170° C. for approximately 1 minute in order to drive off solvents from the paste. The same wafers were then screen printed with an inverse pattern of 14 mm×14 mm patches using phosphorus paste G. Printed wafers were subsequently baked in air at 170° C. for approximately 1 minute in order to drive off solvents from the paste. The resultant pattern on the oxidized wafers was a series of alternating patches of boron-containing paste and phosphorus-containing paste with gaps of non-paste areas separating neighboring patches.

The wafers were then loaded into a quartz tube furnace and subjected to a drive-in process at 925° C. for 1 hour in an $N_2$ ambient. Non-paste covered oxidized wafers were also subjected to the same drive-in process. The wafers were then dipped in a dilute hydrofluoric acid solution to remove the oxide layer. Any residual paste was removed using an ultrasonic water bath for 6 minutes. Doping in the paste areas was monitored via sheet resistance by performing four point probe measurements in those areas. For reference, sheet resistance of non-paste covered wafers was also measured using a four point probe.

Figure 8:
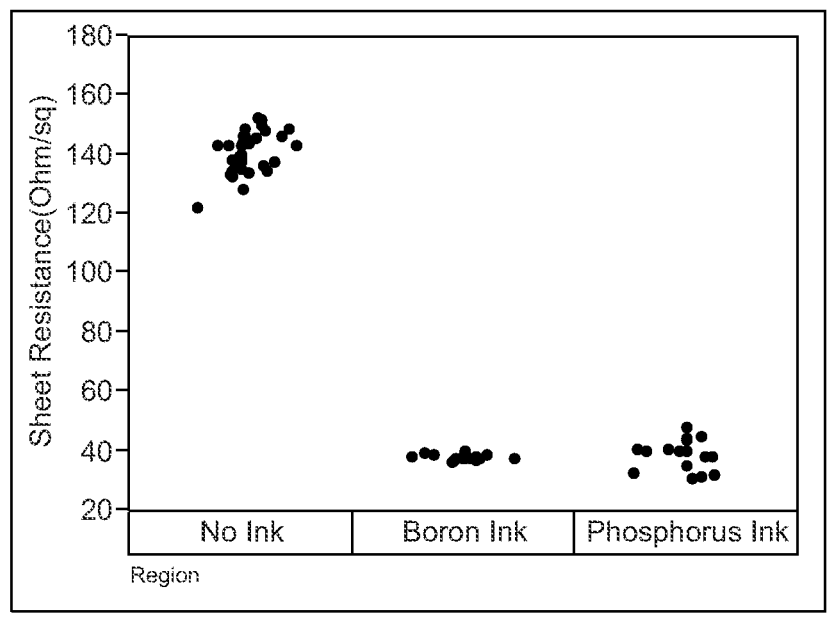
FIG. 8 shows sheet resistance results for non-ink (non-paste) covered wafers and ink (paste) areas on a 50 mm oxide barrier layer after a 925° C. thermal process.
Figure 9:
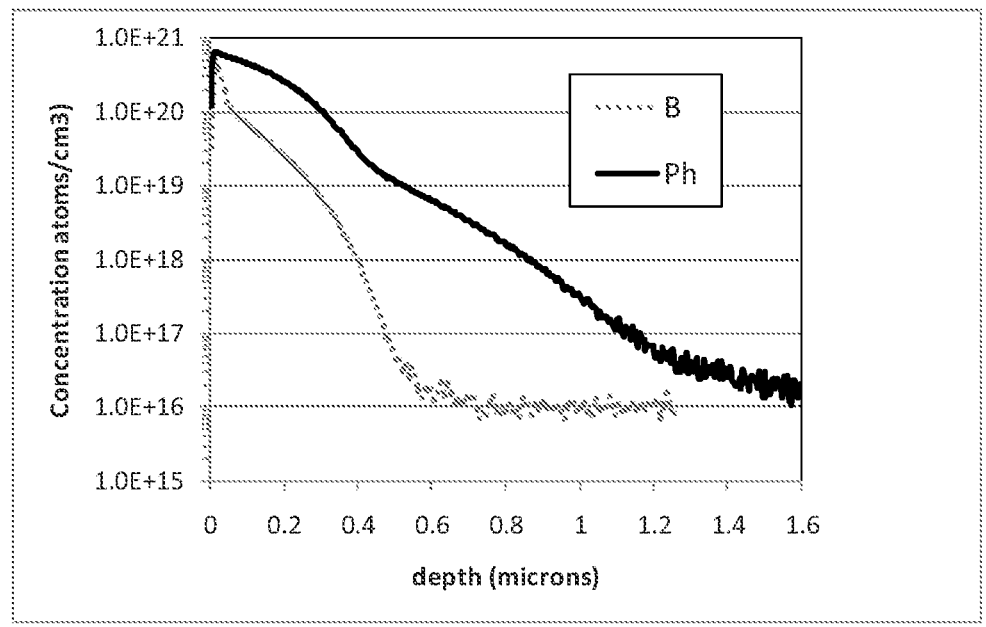
FIG. 9 shows SIMS profiles measured at the center of one of the boron-containing paste regions and at the center of one of the phosphorus-containing paste regions from the same set of wafers measured and represented in FIG. 8.

The result is shown in FIG. 8. Average sheet resistance values from left to right were 141 Ohm/sq, 38 Ohm/sq, and 39 Ohm/sq. As is shown is the figure, heavy doping was achieved for both boron-containing and phosphorus-containing paste regions. These results demonstrate simultaneous boron and phosophorus doping through an oxide layer. FIG. 9 shows secondary ion mass spectrometry (SIMS) profiles measured at the center of one of the boron paste regions and one of the phosphorus paste regions from the same set of wafers measured and represented in FIG. 8. FIG. 9 clearly demonstrates that diffusion of boron and phosphorus into the underlying silicon wafer is achieved in the boron-containing paste and phosphorus-containing paste regions, respectively.

TABLE 2

| Paste | Dopant | Matrix | Binder | Solvent |
|---|---|---|---|---|
| F | Boron Carbide (2 wt %) | $ZrO_2$ (38.9 wt %) | PBMA (4.1 wt %) | TOH:CHO = 95:5 (55 wt %) |
| G | Aluminum dihydrophosphate (ADP) (68 wt %) | none | PBMA (3 wt %) | TOH:CHO = 95:5 (29 wt %) |

Experiment 4

This experiment demonstrates the feasibility of creating a FSF within the method described in FIG. 4. 156 mm pseudo square, 180 micron thick, p-type, 2 Ohm-cm silicon wafers were employed for this experiment. Wafers were subjected to a phosphorus diffusion process in a quartz tube furnace in an ambient of $POCl_3$ introduced via a carrier $N_2$ gas, $N_2$ and $O_2$ gases. A first set of these wafers were subjected to a 20 minute $POCl_3$ diffusion process at 800° C. A second set of these wafers were subjected to a 20 minute $POCl_3$ diffusion process at 820° C. Both $POCl_3$ diffusion processes employed a carrier $N_2$ to $N_2$ ratio of 1:20 and a carrier $N_2$ to $O_2$ ratio of 1:1. After diffusion all wafers were dipped in a dilute HF solution in order to remove the phosphosilicate glass (PSG) layer formed on the silicon surface during the process. Sheet resistance was measured for a set of these wafers from both the 800° C. process and 820° C. process.

Sets of wafers from both the 800° C. and 820° C. $POCl_3$ process were separately subjected to thermal oxidation processes performed in a quartz tube furnace in an $O_2$ ambient at 1000° C. for the following times: 2 hours, 1 hour, 30 minutes, and 10 minutes. Oxide growth on the wafers for the 2 hours, 1 hour, 30 minutes, and 10 minute processes were approximately 80 nm, 50 nm, 40 nm, and 30 nm, respectively.

Figure 10:
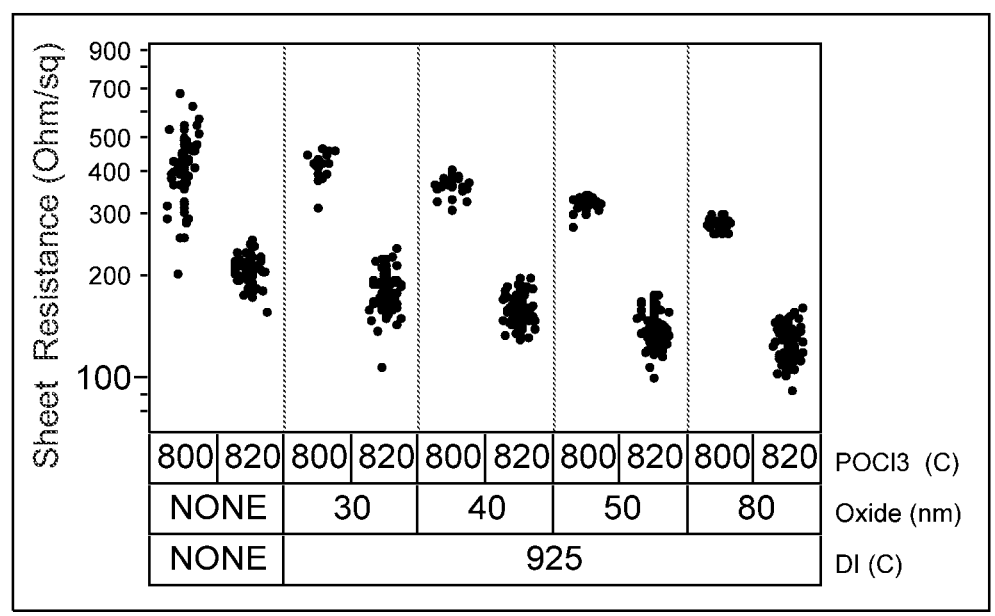
FIG. 10 shows sheet resistance values for two sets of $POCl_3$ diffused wafers subjected to subsequent steps of: no oxidation or drive-in process; and various thermal oxidation processes followed by an inert drive-in process at 925° C.

All oxidized wafers were then subjected to a thermal drive-in step performed in a quartz tube furnace at 925C for 1 hour in an $N_2$ ambient. After the drive-in process wafers were dipped in a dilute HF solution in order to remove their surface oxide layer. Sheet resistance results for all the above conditions are shown in FIG. 10. Average sheet resistance values from left to right were 468, 215, 425, 182, 373, 162, 327, 143, 286, 127 Ohm/sq. It is clear from the results shown in FIG. 10 that for all combinations of oxidation followed by drive-in, the sheet resistance can be modulated via, the initial $POCl_3$ condition allowing for simple tuning of the FSF phosphorus emitter required for fabricating an IBC solar cell.

What is claimed is:

1. A method for manufacturing a photovoltaic cell with a locally diffused rear side, comprising steps of:
    (a) providing a doped silicon substrate, the substrate comprising a front, sunward facing, surface and a rear surface;
    (b) forming a silicon dioxide layer on the front surface and the rear surface;
    (c) depositing a pattern of boron-containing doping paste directly on the silicon dioxide layer on the rear surface, the boron-containing doping paste comprising a boron compound and a solvent, and wherein the silicon dioxide layer covers the whole rear surface of the silicon substrate when the boron-containing doping paste is deposited on the silicon dioxide;
    (d) depositing a pattern of phosphorus-containing doping paste directly on the silicon dioxide layer on the rear surface, the phosphorus-containing doping paste comprising a phosphorus compound and a solvent, and wherein the silicon dioxide layer covers the whole rear surface of the silicon substrate when the phosphorus-containing doping paste is deposited on the silicon dioxide;
    (e) heating the silicon substrate in an ambient inside a furnace to a first temperature and for a first time period in order to locally diffuse boron and phosphorus into the rear surface of the silicon substrate through the silicon dioxide layer, wherein the silicon substrate is placed inside the furnace vertically parallel to at least one silicon substrate having the same structure.

2. A method of claim 1, wherein the whole outer surface of the silicon substrate is oxidized at the step (b).

3. A method of claim 1, wherein the silicon dioxide layer is formed by a method selected from the group consisting of (i) thermal oxidation, (ii) printing and drying a composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer.

4. A method of claim 1, wherein the thickness of the silicon dioxide layer is between 10 nm and 100 nm.

5. A method of claim 1, wherein the boron-containing doping paste comprises a boron compound; a polymer binder; and a solvent.

6. A method of claim 5, wherein the boron-containing doping paste further comprises a ceramic compound.

7. A method of claim 6, wherein the boron compound is between 0.5 and 50 wt %, the ceramic compound is between 0 and 50 wt %, and the polymer binder is between 0.5 and 10 wt % based on the total weight of the boron-containing paste.

8. A method of claim 1, wherein the phosphorus-containing doping paste comprises a phosphorus compound; a polymer binder; and a solvent.

9. A method of claim 8, wherein the phosphorus-containing doping paste further comprises a ceramic compound.

10. A method of claim 9, wherein the phosphorus compound is between 20 and 90 wt %, the ceramic compound is between 0 and 50 wt %, and the polymer binder is between 0.5 and 10 wt % based on the total weight of the phosphorus-containing paste.

11. A method of claim 1, wherein a doped layer is formed on the front surface of the silicon substrate prior to the step (b) and wherein the doped layer is doped with the same dopant as the dopant of the silicon substrate.

12. A method of claim 1, further comprising steps of:
(f) removing the silicon dioxide layer from the silicon substrate, subsequent to the step (e);
(g) forming a passivation layer on both the front surface and the rear surface, subsequent to the step (f); and
(h) forming a first electrode and a second electrode on the rear surface, wherein the first electrode is in electric contact with a first region of the silicon substrate where boron is locally diffused and wherein the second electrode is in electric contact with a second region of the silicon substrate where phosphorus is locally diffused.

13. A method of claim 12, wherein a doped layer is formed on the front surface of the silicon substrate between the step (f) and step (g), and wherein the doped layer is doped with the same dopant as the dopant of the silicon substrate.

14. A method of claim 1, wherein the first temperature is 850-1000° C., and the ambient is nitrogen.

15. A method of claim 1, wherein the manufactured photovoltaic cell is an interdigitated back contact solar cell comprising a p+ diffusion area and an n+ diffusion area on the rear surface of the silicon substrate, and further comprising a first metal electrode in ohmic contact with the p+ diffusion area and a second metal electrode in ohmic contact with the n+ diffusion area.

16. A method of claim 1, wherein the silicon dioxide layer is formed by a method selected from the group consisting of printing and drying a composition comprising silicon dioxide particles, chemical vapor deposition, chemical oxidation, steam oxidation, printing and oxidizing a composition comprising of silicon particles, and growing and oxidizing a porous silicon layer.

17. A method of claim 1, wherein the first time period is 20 minutes to 2 hours.

18. A method for manufacturing a photovoltaic cell with a locally diffused rear side, comprising steps of:
(a) providing a doped silicon substrate, the substrate comprising a front, sunward facing, surface and a rear surface;
(b) subsequent to the step (a), performing a $POCl_3$ diffusion process to form an n+layer on the front surface and the rear surface;
(c) subsequent to the step (b), removing the n+ layer on the rear surface while leaving the n+ layer on the front surface;
(d) subsequent to the step (c), forming a silicon dioxide layer on the front surface and the rear surface;
(e) subsequent to the step (d), depositing a pattern of boron-containing doping paste directly on the silicon dioxide layer on the rear surface, the boron-containing doping paste comprising a boron compound and a solvent;
(f) subsequent to the step (e), depositing a pattern of phosphorus-containing doping paste directly on the silicon dioxide layer on the rear surface, the phosphorus-containing doping paste comprising a phosphorus compound and a solvent, and wherein the deposited boron-containing paste and the deposited phosphorus-containing paste form an interdigitated pattern;
(g) subsequent to the step (f), heating the silicon substrate in an ambient inside a furnace to a first temperature and for a first time period in order to locally diffuse boron and phosphorus into the rear surface of the silicon substrate through the silicon dioxide layer, wherein boron and phosphorus are diffused only into the rear surface of the silicon substrate, wherein the silicon substrate is placed inside the furnace vertically parallel to at least one silicon substrate having the same structure;
(h) subsequent to the step (g), removing the silicon dioxide layer from the silicon substrate;
(i) subsequent to the step (h), forming a passivation layer on both the front surface and the rear surface; and
(j) forming a first electrode and a second electrode on the rear surface, wherein the first electrode is in electric contact with a first region of the silicon substrate where boron is locally diffused and wherein the second electrode is in electric contact with a second region of the silicon substrate where phosphorus is locally diffused.

19. A method of claim 18, wherein the silicon substrate is heated in an ambient inside a furnace, wherein the first temperature is 850-1000° C., wherein the first time period is 20 minutes to 2 hours.

20. A method for manufacturing a photovoltaic cell with a locally diffused rear side, comprising steps of:
(a) providing a doped silicon substrate, the substrate comprising a front, sunward facing, surface and a rear surface;
(b) forming a silicon dioxide layer on the front surface and the rear surface by a method selected from the group consisting of (i) thermal oxidation, (ii) printing and drying a composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer;
(c) depositing a pattern of boron-containing doping paste directly on the silicon dioxide layer on the rear surface, the boron-containing doping paste comprising a boron compound and a solvent, and wherein any portion of the boron-containing paste is not in direct contact with the doped silicon substrate;
(d) depositing a pattern of phosphorus-containing doping paste directly on the silicon dioxide layer on the rear surface, the phosphorus-containing doping paste comprising a phosphorus compound and a solvent, and wherein any portion of the phosphorus-containing paste is not in direct contact with the doped silicon substrate; and
(e) heating the silicon substrate in an ambient inside a furnace to a first temperature and for 20 minutes to 2 hours in order to locally diffuse boron and phosphorus into the rear surface of the silicon substrate through the silicon dioxide layer, wherein the silicon substrate is placed inside the furnace vertically parallel to at least one silicon substrate having the same structure.

* * * * *